Figure 1:
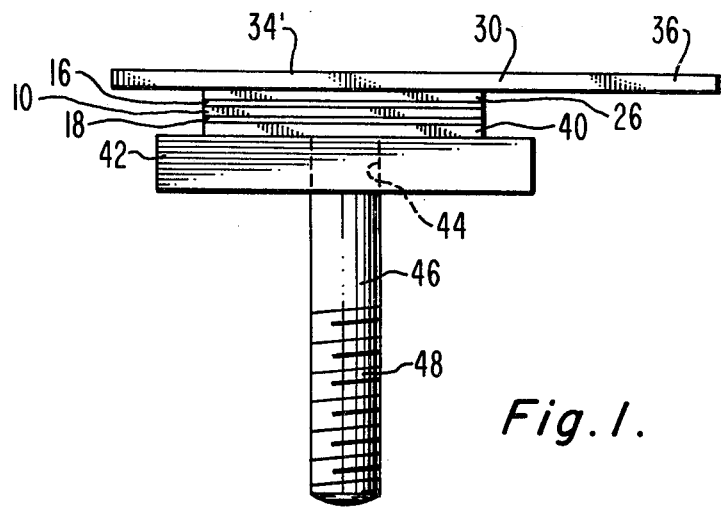

United States Patent [19]

Klein

[11] 4,209,347
[45] Jun. 24, 1980

[54] MOUNTING FOR SOLAR CELL
[75] Inventor: Norman S. Klein, Freehold, N.J.
[73] Assignee: RCA Corporation, New York, N.Y.
[21] Appl. No.: 36,190
[22] Filed: May 4, 1979
[51] Int. Cl.$^2$ ............................................ H01L 31/04
[52] U.S. Cl. ........................... 136/89 PC; 136/89 CA; 250/238; 250/239; 357/81
[58] Field of Search .......... 136/89 CA, 89 CC, 89 P, 136/89 PC; 250/238, 239; 357/30, 81

[56] References Cited

U.S. PATENT DOCUMENTS

| | | | |
|---|---|---|---|
| 2,931,847 | 4/1960 | Dahlstrom et al. | 136/89 |
| 2,963,390 | 12/1960 | Dickson, Jr. | 148/1.5 |
| 3,004,168 | 10/1961 | Emeis | 250/211 |
| 3,859,143 | 1/1975 | Krebs | 136/205 |
| 4,149,310 | 4/1979 | Nippert | 29/630 R |
| 4,152,175 | 5/1979 | Burgess et al. | 136/89 PC |

*Primary Examiner*—Weisstuch, Aaron
*Attorney, Agent, or Firm*—Samuel Cohen; William Squire

[57] ABSTRACT

A mounting for a silicon solar cell comprises a layer of molybdenum on the back surface of the cell and a molybdenum wire along the peripheral edge of the radiation receiving surface of the cell. An electrode formed with an aperture aligned with the radiation receiving surface abuts and is secured along the border of the aperture to the wire and a heat sink is in conductive contact with the molybdenum layer. The coefficients of expansion of the molybdenum and silicon are similar and this protects the relatively brittle cell from damage when its temperature is changed.

20 Claims, 4 Drawing Figures

MOUNTING FOR SOLAR CELL

The present invention relates to solar cell module constructions.

A well known form of solar cell comprises a wafer of semiconductor material which includes a base region of one conductivity type and an emitter region of opposite conductivity type. A metallized electrode grid on the surface of the emitter region is employed for receiving majority carriers generated within the semiconductor material in response to incident solar radiation. The grid may be in the form of an array of metallized conductors which terminate at an edge or edges of the cell face. A bus conductor on the grid at the edge or edges of the cell face is employed to conduct the majority carriers conducted by the various grid members to a single conductor.

An improved cell of the general type discussed above is disclosed in co-pending application Ser. No. 36,039, filed May 4, 1979, entitled *Solar Cell Grid Patterns* by Louis Sebastian Napoli and assigned to the assignee of the present invention.

It includes a grid pattern in which the grid members are formed on a square cell and the grid members terminate on each side of the square. For this cell construction, a square bus conductor is required to be placed in contact with the grid pattern at the cell face edges. A metallized conductor of aluminum, copper, silver or gold is deposited on the opposite surface of the semiconductor material on the base region. This type of cell is used with concentrators using lenses which focus solar energy onto the cell face. These types of solar cells and, in particular, the one just described, have a relatively large surface area with respect to the thickness of the semiconductor material.

A semiconductor material made of silicon is relatively brittle and fractures easily when stressed. In the past it has been the usual practice to mount the cell on a heat sink, usually copper, which is of a relatively large mass. The grid bus is connected to a relatively large electrode, usually made of copper or similar highly electrically conductive material. However, due to the relatively thin construction and large active area of the semiconductor cell, and the relatively large differences in the coefficient of thermal expansion between the cell material and the copper interconnect electrode which interconnects the cells to form an array and heat sink these materials are not completely suitable for a modular system. Temperature cycling causes different linear expansions of the different materials and the mechanical stress thereby created sometimes fractures the relatively weaker thin semiconductor material.

In a mounting embodying the invention, a relatively brittle solar cell semiconductor wafer is protected from damage due to changes in its temperature by mounting it between two relatively strong conductive elements which have coefficients of expansion close to that of the wafer. One of the elements is formed on the back surface of the wafer and the other comprises a wire along the periphery of the image receiving surface of the wafer. An electrode formed with an aperture therein aligned with the image receiving surface is bonded to the wire along the border of the aperture and a heat sink is bonded to the one element.

Figure 2:
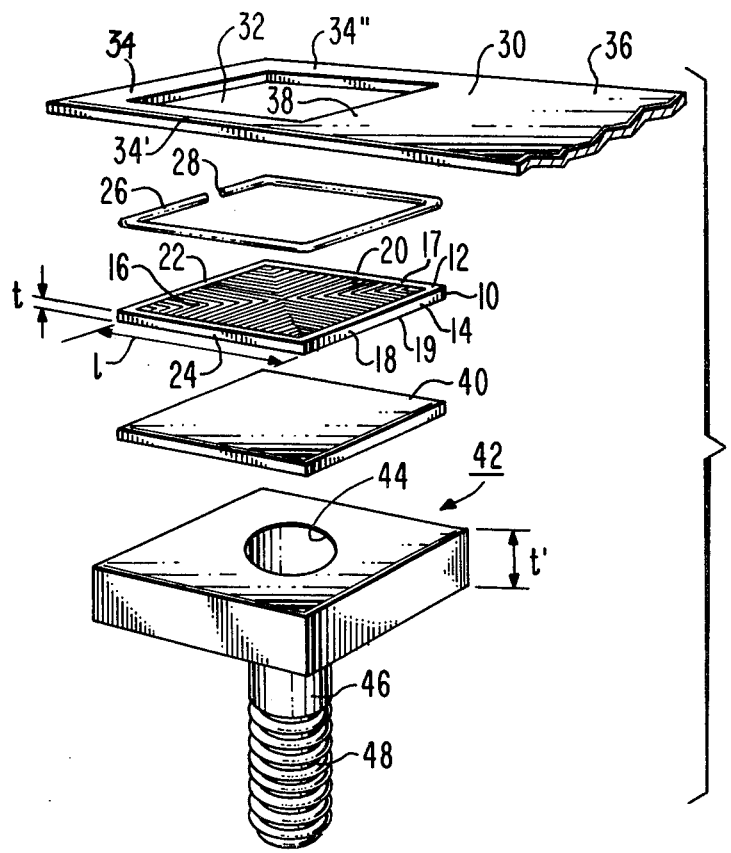
Figure 3:
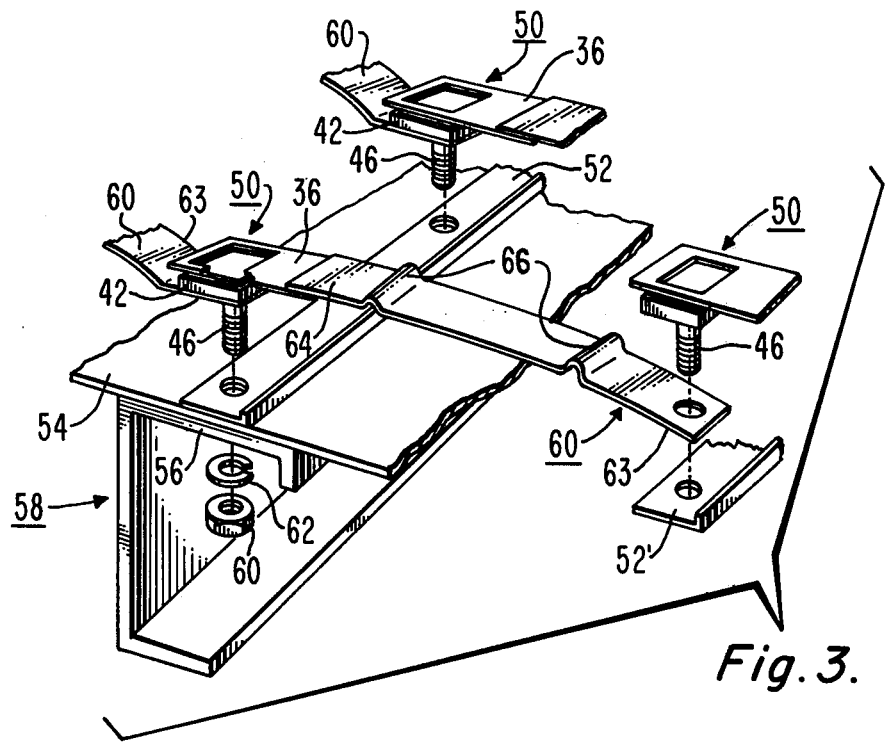
Figure 4:
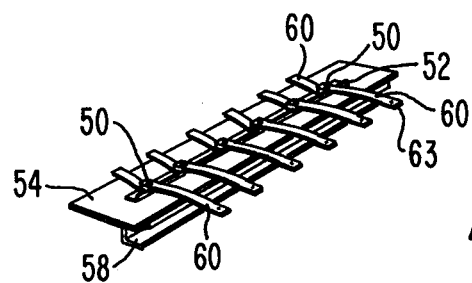

In the drawing:

FIG. 1 is a side elevation view of a solar cell construction embodying the present invention, FIG. 2 is an exploded perspective view of the cell of FIG. 1, FIG. 3 is an enlarged perspective view of a portion of a cell array, and FIG. 4 is a perspective view of the solar cell array of FIG. 3 including a solar cell construction embodying the present invention.

FIGS. 1 and 2 show a solar cell construction in which a wafer 10 of semiconductor material such as silicon is doped to make it either N or P type to form an emitter region or layer 12, while the remainder of the wafer 10 is doped to make it of opposite conductivity type to form the base region 14. Solar energy is concentrated by lenses or other means (not shown) onto the emitter layer 12. This produces majority carriers, which may be electrons or holes, depending on the polarity of the emitter and base regions, and which migrate toward the surface of the emitter layer 12.

In the cell disclosed in co-pending application mentioned in the introduction, the cell semiconductor wafer is square in plan view. The cell wafer 10 has a much thinner dimension t than the length l of its sides. For example, t may be 0.005 inches and l may be 0.660 inches. The wafer 10 preferably is made out of a relatively brittle material such as silicon or other photosensitive material.

To collect the electrons or holes, a grid pattern 16 is deposited on the emitter layer 12. Preferably, the grid pattern 16 is of the type disclosed in the co-pending application mentioned above. Briefly, the grid structure comprises an array of L shaped grid members which are in nested spaced relationship on the surface of the emitter layer 12. The grid structure 16 is divided into four symmetrical quadrants of substantially the same construction. The legs of the grid members in each half quadrant are identical to the legs in each of the remaining half quadrants. In this construction the grid members terminate at square bus 17 adjacent sides 18, 20, 22, and 24 of the emitter layer 12. Bus 17 is a metallized pattern deposited with the grid pattern 16 on the emitter and extends around the periphery of the emitter layer 12 on the cell face.

A bus wire 26 collects the generated electricity from the grid structure 16 via the bus 17. The wire 26 is broken at 28 to illustrate its circular cross section. It may instead have some other cross section. The wire 26 is made of refractory material such as molybdenum, which has a linear expansion close to that of wafer 10. Wire 26 is formed into a square and is in contact with bus 17.

A copper electrode 30 is formed with a square aperture 32. Aperture 32 is of about the same size as the active cell face area of emitter layer 12 and is centrally positioned over the emitter layer 12. Electrode 30 is first brazed with lead-tin solder to wire 26 at the borders 34, 34', 34" and 38 of the aperture 32 to form a subassembly. A tab 36 extends from the electrode to form an interconnecting terminal. The electrode 30, for example, may be two inches in length of which tab 36 is approximately one inch long. Wire 26 of the subassembly comprising electrode 30 and wire 26 is then soldered to bus 17.

A metallized electrode 19 is deposited over the entire base region area on the underside of the wafer 10 and is soldered to a square sheet 40 of molybdenum. The sheet 40 may be 0.035 inches thick and have the same length l as the wafer 10. The extent of the area on a side of the sheet 40 facing wafer 10 is approximately the same as the facing area of the electrode 19 and the base region 14.

A heat sink 42 is formed of a block of copper, which is square in plan view and is relatively thick with respect to the thickness of the wafer 10. For example, the block may have a thickness t' of about 3/16 inches. The side dimension of the block may be slightly larger than the dimension l on wafer 10. For example, it may be 0.750 inches on a side. The block 42 has a central circular aperture 44 in which is brazed a stud 46 which may also be copper. Stud 46 is threaded at its depending end 48. The assembly forms a sandwich of materials best seen in FIG. 1. Preferably the sink 42 is first brazed to sheet 40 as a subassembly. Then the sheet 40 is soldered to electrode 19.

The relatively thin wafer 10 has a thickness which is very much smaller than its length, e.g., by a factor of more than 50. If wafer 10 were mounted directly to a heat sink block, such as block 42, or an electrode 30, it would be subject to mechanical stress when placed in an environment of thermal cycling. For example, during normal use the construction should be able to withstand temperatures of −40° C. to +90° C. However, the coefficient of thermal expansion of copper is significantly different than the coefficient of thermal expansion of silicon. As a result, the difference in thermal expansions of the copper with respect to the silicon wafer 10 results in a mechanical stress induced in these materials. The wafer, being relatively thin and more brittle than the copper electrodes and heat sink, fractures easily.

To prevent this from occurring, the molybdenum wire 26 on the grid structure and the molybdenum sheet 40 on the back surface of the electrode provide a mechanical interface for thermal stresses induced by differences in coefficients of thermal expansion. That is, the molybdenum wire 26 and sheet 40 have a coefficient of thermal expansion which closely matches that of the silicon wafer 10. Therefore, during thermal cycling, relatively little mechanical stress occurs in the wafer 10 due to the matched linear expansions between wafer 10, wire 26 and sheet 40.

Since the copper electrode 30 is brazed to the wire 26 and the heat sink 42 is brazed to the sheet 40, the differences in linear expansion due to thermal cycling induces stress between these two materials. However, since copper is ductile and the molybdenum is a high strength material, the difference in linear expansion between them does not cause any stress failure between them. Therefore, the assembly can be subjected to a wide range of thermal cycling without mechanical stress failure due to changes in the linear expansion of these different materials.

The construction of FIGS. 1 and 2 also forms a convenient assembly for forming an array of solar cells. In FIG. 3, assemblies 50 are identical solar cell constructions constructed as shown in FIGS. 1 and 2. The stud 46 is inserted in an aperture in aluminum strip 52 whichh is an L shaped elongated aluminum member, then through an aperture in an aluminum sheet 54 and an aperture in leg 56 of channel 58, which is also aluminum. Nut 60 and lock washer 62 secure the stud 46 to the strip 52, sheet 54 and leg 56 which provide electrical connections between the studs 46 of adjacent cells 50 and also serve as heat sinks for thermal energy conducted from the blocks 42 and studs 46. A flexible elongated thin copper connector ribbon 60 is secured to the underside of the block 42 at end 62. The other end 64 of the ribbon is soldered to tab 36 of one of the respective solar cell assemblies 50. Thermal expansion kinks 66 are provided in the ribbon 60 to allow for differences in thermal expansion of the ribbon during temperature cycling. The assembly of FIG. 3 is formed into an array as shown in FIG. 4.

What is claimed is:

1. A solar cell construction comprising:
   a wafer of semiconductor photosensitive material including a base region of one conductivity type and an emitter region of opposite conductivity type, said wafer having a coefficient of thermal expansion of a first value,
   an electrode grid structure in electrical contact with said emitter region for conducting charge carriers from said emitter region to an edge of said wafer,
   a first electrically conductive electrode in ohmic and thermal conductive contact with said base region over an area of about the same extent as said base region and having a coefficient of thermal expansion close in value to said first value,
   a second electrically conductive electrode in ohmic and thermal conductive contact with said grid structure at said edge of said wafer and having a coefficient of thermal expansion close in value to said first value,
   an electrical conductor in ohmic and thermal conductive contact with said second electrode and having a coefficient of thermal expansion substantially different than said first value, and
   a block of electrically conductive heat sink material in ohmic and thermal conductive contact with said first electrode over said area for cooling said wafer and said electrodes, said block having a coefficient of thermal expansion substantially different than said first value.

2. The construction of claim 1 further including mounting means attached to said block.

3. The construction of claim 1 wherein said first and second electrodes are the same refractory metals.

4. The construction of claim 3 wherein said first electrode is a sheet of molybdenum and said second electrode is a molybdenum wire.

5. The construction of claim 1 wherein said wafer, electrodes, conductor and block of material are joined by lead-tin solder.

6. The construction of claim 1 wherein said wafer has a geometrically shaped periphery, said grid structure terminating at spaced locations along said periphery, said second electrode having said geometrical shape and extending along said periphery.

7. The construction of claim 6 wherein said second electrode is an elongated member of restricted cross section formed of a refractory metal.

8. The construction of claim 1 wherein said wafer is silicon material, said first and second electrodes are refractory metals, and said conductor and heat sink material are copper.

9. A solar cell device comprising:
   a solar cell generator comprising a body of semiconductor material having a base region of a first conductivity type and an emitter region of a second conductivity type opposite said first conductivity type, said emitter region having a light receiving face, and the thickness of said cell being much less than the cell face perimeter,
   a metallized grid structure on said cell face terminating at an edge of said cell at said perimeter, a strip of refractory metal in ohmic contact with said grid structure at said edge, a non-ferrous electrical metal conductor electrode in ohmic contact with said refractory metal electrode and having a solar energy transmissive aperture over said cell face, a sheet of refractory metal in thermal and ohmic contact with said base region over an area of approximately the same extent as said base region on a side opposite said emitter region, and a non-ferrous electrical metal electrical conductor and heat sink member having a thickness substantially greater than the thickness of said layer in ohmic and thermal contact with said sheet over an area of about the same extent as said sheet.

10. The device of claim 9 wherein said non-ferrous conductors are copper and said refractory metal is molybdenum.

11. The device of claim 9 wherein said electrode is a sheet of copper including a lip extending around said cell face and a tab extending from said lip in a direction approximately parallel with the plane of said cell face.

12. The device of claim 9 further including a stud member depending from said heat sink member.

13. A solar cell construction comprising a relatively thin, relatively brittle wafer of semiconductor material having a radiation receiving surface and a back surface comprising, in combination:

first conductive electrode of about the same size as the wafer, and having a coefficient of expansion very close to that of the wafer, formed on the back surface of the wafer;

a conductive wire which has a coefficient of expansion very close to that of the wafer and which serves as a collector of charge carriers produced by said solar cell, located at the radiation receiving surface of the wafer along the peripheral edge of said surface, the wafer being supported between said conductive electrode and said wire;

a second electrode comprising a conductive metal formed with an aperture therein aligned with the radiation receiving surface of the wafer so that radiation can pass through the aperture to said solar cell, the second electrode abutting and being conductively secured to said wire at one surface thereof along the border of said aperture; and an electrically conductive heat sink having a surface at least equal in size to said first conductive electrode conductively secured to said first conductive electrode.

14. A solar cell construction as set forth in claim 3 wherein said wafer is formed of silicon and said first electrode and said wire are formed of the same refractory metal.

15. A solar cell construction as set forth in claim 13 wherein said refractory metal is molybdenum.

16. A solar cell construction as set forth in claim 15 wherein said second electrode is formed of copper.

17. A solar cell array comprising:

a plurality of like solar cell constructions, each construction comprising a wafer of semiconductor material having a radiation receiving surface and a back surface, said wafer being located between (a) one surface of a first conductive electrode on the back surface of the wafer and (b) a second electrode comprising a relatively highly conductive metal in electrical contact with the wafer and formed with an aperture therein aligned with the radiation receiving surface of the wafer so that radiation can pass through the aperture to said wafer, and a heat sink conductor having a surface at least equal in size to the first electrode and heat conductively coupled at said last mentioned surface with the other surface of said first conductive electrode;

first and second spaced apart heat sink members;

means thermally and electrically connecting a first group of said solar cell constructions via their respective heat sink conductors to said first heat sink member;

means thermally and electrically connecting a second, different group of said solar cell constuctions via their respective heat sink conductors to said second heat sink member; and means electrically connecting the second electrode of each cell construction of said first group to the first electrode of a corresponding cell construction of the second group.

18. The array of claim 17 wherein each heat sink conductor includes connecting means for connecting that conductor to a heat sink member.

19. The array of claim 18 wherein said connecting means includes a threaded stud member depending from said heat sink conductor and means for securing said stud member to a heat sink member.

20. The array of claim 17 wherein said heat sink members extend in columns and said electrically connecting means extend in rows.

* * * * *